United States Patent [19]

Gotoh et al.

[11] Patent Number: 5,030,847
[45] Date of Patent: Jul. 9, 1991

[54] PULSE-WIDTH MODULATOR AND DRIVING CIRCUIT

[75] Inventors: Yasuhiro Gotoh, Kadoma; Koichi Yamada, Neyagawa; Shigeyoshi Hayashi, Kusatsu, all of Japan

[73] Assignees: Rohm Co., Ltd., Kyoto; Matsushita Electric Industrial Co., Ltd., Osaka, both of Japan

[21] Appl. No.: 381,940

[22] Filed: Jul. 19, 1989

[30] Foreign Application Priority Data

Jul. 22, 1988 [JP] Japan ................. 63-184386

[51] Int. Cl.⁵ .................. H03K 5/153; H03K 3/01
[52] U.S. Cl. ..................... 307/265; 307/234; 307/270; 307/355
[58] Field of Search ............. 307/265, 234, 228, 362, 307/270; 328/58, 111, 120

[56] References Cited
U.S. PATENT DOCUMENTS 3,260,912  7/1966  Gregory ........................... 307/265
3,551,851 12/1970  Engel ............................. 307/265
3,743,911  7/1973  Erler ............................. 307/265
3,978,424  8/1976  Hobo et al. ...................... 331/45
4,813,339  3/1989  Uno et al. ....................... 307/265
4,820,940  4/1989  Wachi et al. ..................... 307/228

FOREIGN PATENT DOCUMENTS 0100103 2/1984 European Pat. Off. .
2452120 5/1976 Fed. Rep. of Germany .

Primary Examiner—Timothy P. Callahan
Attorney, Agent, or Firm—Stevens, Davis, Miller & Mosher

[57] ABSTRACT

A pulse-width modulator and a driving unit using the same produce from an input signal, two pulse-width modulated signals of different phases with their pulse widths changing in opposite directions, and then produce final modulated signals from the difference between the pulse widths of the two pulse width modulated signals of different phases, thereby increasing the precision.

12 Claims, 17 Drawing Sheets

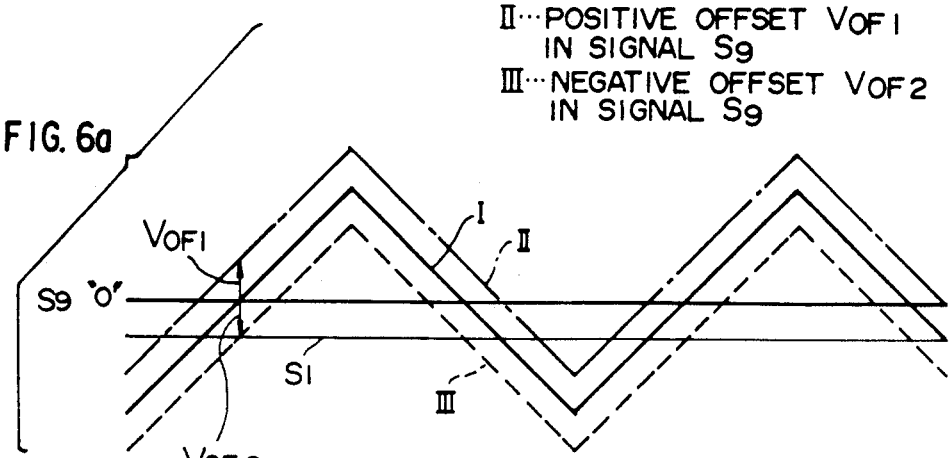
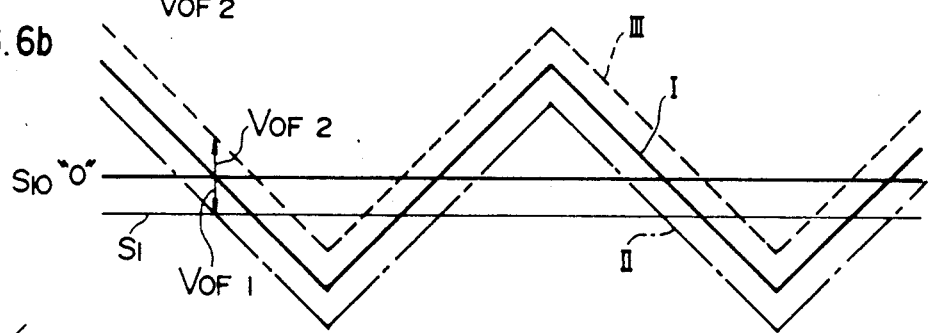
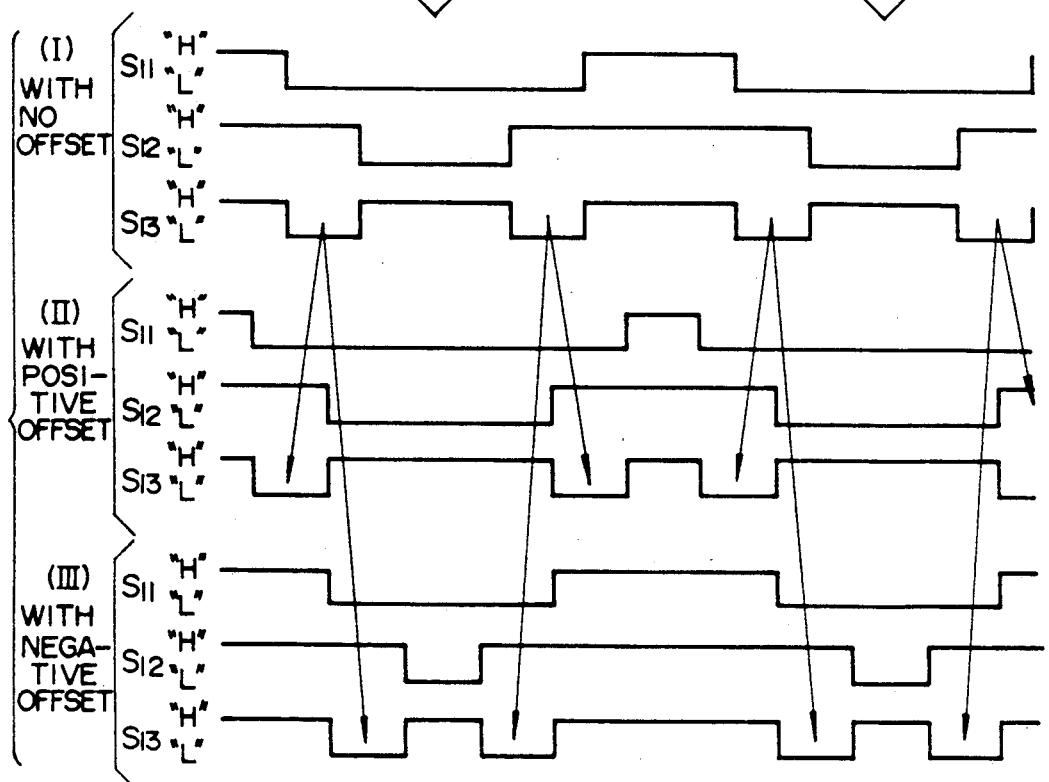

FIG. 8
FIG. 8a
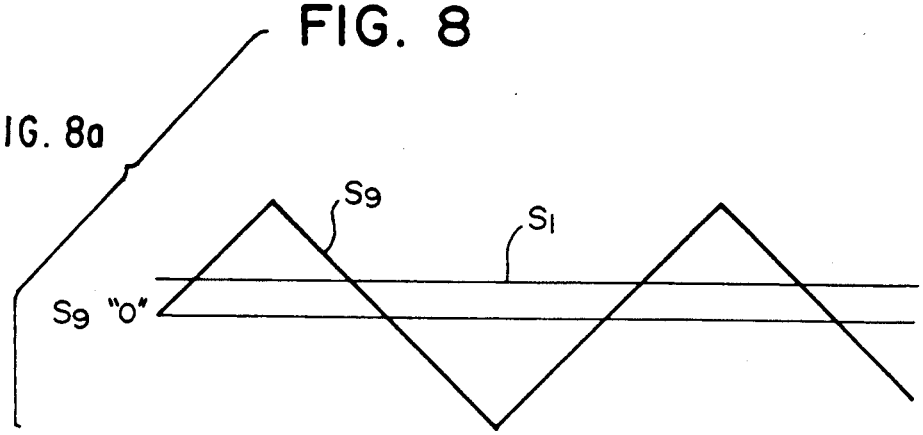
FIG. 8b
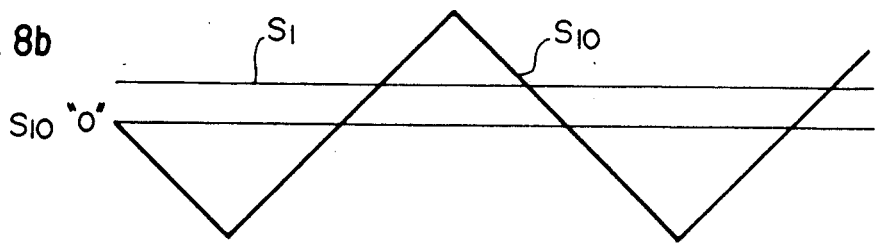
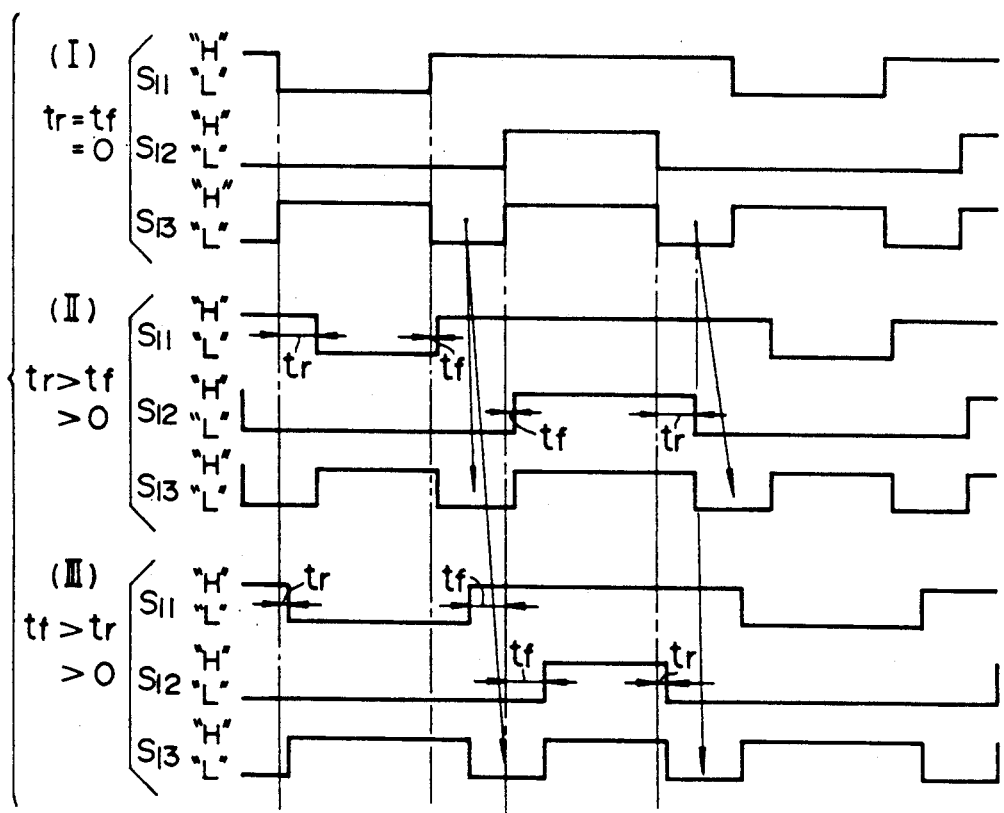
FIG. 8c

FIG. II

POSITIVE S1

NEGATIVE S1

PULSE-WIDTH MODULATOR AND DRIVING CIRCUIT

BACKGROUND OF THE INVENTION

This invention relates generally to pulse-width modulators for converting an analog signal into a pulse-width modulated signal and to driving units for actuators to be used in optical-type recording and/or reproducing apparatus, and particularly relates to a driving unit which forces an output transistor to turn on and off at a high frequency and controls its on-state period with the aid of the pulse-width modulator.

In the optical-type recording and/or reproducing apparatus, as is well known, the tracking control and the focusing control are made on the very small spot of focused light, and thus an actuator is needed to move optical components such as an object lens and so on which constitute the optical head, thereby moving the light spot.

In recent years, as small-sized and power-saving apparatus have been requested, a driving method using a high-efficiency pulse-width modulation system had been employed.

FIG. 12 shows the arrangement of a conventional pulse-width modulator and driving unit which employs it to drive the actuator, and FIG. 13 is a waveform diagram of waveforms at each portion of the arrangement of FIG. 12. Referring to FIG. 12, an input signal S1 is supplied to a comparator 1 and to an absolute value circuit 2. The comparator 1 discriminates the polarity of the input signal S1 to produce a digital signal S2 which is, as shown in FIG. 13, level "H" when the signal S1 is positive (+) relative to the reference level "0" and is level "L" when it is negative (−). This signal S2 is supplied to an invertor 3 to produce therefrom a signal S3 which is the inversion of the signal S2.

The absolute value circuit 2 is used to produce the absolute value of the input signal S1. As shown in FIG. 13 at S4, the absolute value circuit produces the signal S1 when the signal S1 is positive, and it produces the inversion of the signal S1 relative to the "0" level, or the absolute value signal S4. This signal S4 is supplied to the non-inverting input terminal of a comparator 4. To the inverting input terminal thereof is supplied a triangular wave signal S5 of a high frequency (several tens of kHz to several hundreds of kHz) which rises from the "0" level, and which is produced from a triangular wave generation circuit 5. These signals are compared with each other by this comparator 4 to produce a signal S6 which is level "H" when the signal S4 is larger than the signal S5, and "L" when the signal is smaller than the signal S5. This signal S6 is a pulse-width modulated signal of which the "H" period increases in proportion to the level of the signal S4. This signal S6 is supplied to NAND gates 6 and 7. The signal S2 is supplied to the other input of the NAND gate 6, and the signal S3 to the other input of the NAND gate 7. Thus, the NAND gate 6 produces a signal S7 which, as shown in FIG. 13, becomes the inversion of the signal S6 when the signal S2 is "H", and becomes "H" when the signal S2 is "L". The NAND gate 7 produces a signal S8 which, as shown in FIG. 13, is "H" when the signal S2 is "H", and is the inversion of the signal S6 when the signal S2 is "L".

The signals S2, S3, S7 and S8 are supplied to a switching circuit 8. In the switching circuit 8, the emitters of PNP transistors Q1 and Q2 are connected to a power supply Vcc, while the emitters of NPN transistors Q3 and Q4 are grounded. The collectors of the transistors Q1 and Q3 are connected to a terminal 18a of an actuator 18, and the collectors of the transistors Q2 and Q4 to a terminal 18b thereof. A flywheel diode D1 has its anode grounded and its cathode connected to the terminal 18a. A flywheel diode D2 has its anode grounded and its cathode connected to the terminal 18b. The signal S7 is supplied to the base of the transistor Q1 through a resistor R1, the signal S8 is supplied to the base of the transistor Q2 through a resistor R2, the signal S2 is supplied to the base of the transistor Q4 through a resistor R3, and the signal S2 is supplied to the base of the transistor Q4 through a resistor R4. For the convenience of explanation, it is assumed that these transistors make the ideal operation in which the on-resistance is 0 Ω and the off-resistance is ∞.

When the input signal S1 is positive, as described above the signal S3 is "L", and the signal S8 is "H", so that the transistors Q2 and Q3 are in the off-state. Also, the signal S2 is "H" so that the transistor Q4 is in the on-state, thus, the terminal 18b being grounded. This results in the equivalent circuit as shown in FIG. 14(a). In this circuit, a drive current Ia proportional to the "L" period of signal S7 which corresponds to the on-period of the transistor Q1 is flowed from the terminal 18a to the terminal 18b.

On the contrary, when the signal S1 is negative, the signal S2 is "L", and the signal S7 is "H", so that the transistors Q1 and Q4 are turned off. Also, since the signal S3 is "H", the transistor Q3 is in the on-state, thus the terminal 18a being grounded. This results int he equivalent circuit as shown in FIG. 14(b). Thus, as in FIG. 14a, the drive current Ia is proportional to the "L" period of the signal S8 which corresponds to the on-period of the transistor Q2 and flows from the terminal 18b to the terminal 18a.

Therefore, if the current flowing from the terminal 18a to the terminal 18b is a positive current, the drive current Ia is proportional to the input signal S1 and flows to the actuator 18 as shown in FIG. 15.

While int he above description, the output signal S5 from the triangular wave generation circuit 5 rises from the "0" level, the case in which the triangular wave S5 rises from an off-set level above the "0" level will be described below.

FIG. 16 is a waveform diagram of waveforms at each portions of the arrangement of FIG. 12 in the case where the signal S5 has an off-set voltage Vof1 in the positive direction. Referring to FIG. 16, when the signal S4 is lower than the voltage Vof1, the signal S6 is always "L" and the two pulse-width modulated signals S7 and S8 are "H". Thus, the insensitive zone in which no pulse occurs is caused, so that the transistors Q1 and Q2 are in the off-state, thus no current Ia flows. Therefore, the current Ia with respect to the signal S1 has the insensitive zone, Vdz as shown in FIG. 17.

FIG. 18 is a waveform diagram of waveforms at each portions of the arrangement of FIG. 12 in the case where the signal S5 has an off-set voltage Vof2 in the negative direction. Referring to this figure, even when the signal S4 reaches "0" level, the signal S4 is larger than the minimum level of the signal S5. At this time, the signal S6 becomes "H" only for the period, ΔT corresponding to the off-set voltage Vof2. Thus, when the signal S1 is changed form the positive to negative or from negative to positive level, the pulse-width modulated signal S7 or S8 may have such pulse width ("L" period) as to discontinuously skip not via "0" as $\Delta T \rightarrow -\Delta T$ or $-\Delta T \rightarrow \Delta T$ (it is assumed that the pulse width of "L" level of signal S7 is represented by $+$, and that the pulse width of "L" level of signal S8 is denoted by $-$) (hereinafter, this skip characteristic is called the discontinuous characteristic). In addition, the "L" period of the signal S7 or S8 relative to the signal S1 is longer than in the case of FIG. 13. Thus, the drive current Ia vs signal S1 characteristic is as shown in FIG. 19, that is, the current Ia is discontinuously changed at around "0" of signal S1 as $+\Delta I1 \rightarrow -\Delta I1$.

Moreover, in FIG. 12, the comparator 4 has a response time in which the triangular wave signal S5 and the absolute value signal S4 are compared with each other, this response time being another factor which causes the discontinuous characteristic and the insensitive zone. If the relation between the rise time, tr and fall time tf of this comparator is tr > tf, the "L" period of the signal S6 becomes short, thus causing the insensitive zone in the pulse-width modulated signals S7 and S8 as in FIG. 16 and also the insensitive zone int he characteristic of the drive current with respect to the input signal S1. On the contrary, if tf > tr, the "L" period of the signal S6 becomes long, so that the discontinuous characteristic is caused in the relation of the input signal to the pulse-width modulated signals S7 and S8 or to the drive current.

As described above, the conventional pulse-width modulator has the drawback that the insensitive zone and the discontinuous characteristic are easy to be caused by the off-set of the triangular wave signal and the response time of the comparator, making the pulse-width modulated signal erroneous. The driving unit using this modulator is similarly easy to produce the insensitive zone and the discontinuous characteristic, so that it is impossible to obtain a correct drive current proportional tot he input signal.

Moreover, when this conventional driving unit is incorporated in the controller for the driving of the actuator of the optical recording and/or reproducing apparatus, occurrence of the insensitive zone will result in the fact that even if the input signal is changed in the sensitive zone, the current Ia flowing into the actuator is not changed. Consequently, the gain is reduced so that the controller cannot maintain high-precision control. In addition, when the discontinuous characteristic appears, the current to the actuator is greatly changed with the change of the input signal around "0" level so as to increase the equivalent gain, thus making the control system unstable.

Further, the triangular wave signal rising from the "0" level, or the off-set is easy to occur as shown in FIGS. 16 and 18. Also, since the frequency of the triangular wave signal is normally as high as several tens of kHz to several hundreds of kHz, it is difficult to realize a comparator which can operate at so high a frequency that the period can be neglected.

Therefore, the insensitive zone and the discontinuous characteristic becomes great, making it further difficult to operate the pulse-width modulator and the driving unit using it with high precision.

SUMMARY OF THE INVENTION

It is an object of this invention to provide a pulse-width modulator capable of preventing the insensitive zone and the discontinuous characteristic from being caused by the off-set of the triangular wave signal or by the presence of the difference between the rise time and the fall time of the comparator so as to produce a correct pulse-width modulated signal, and provide a driving unit using the pulse-width modulator, which can supply a correct drive current proportional to the input signal.

In order to achieve the above object, this invention proposes a pulse-width modulator which is arranged to produce a first pulse-width modulated signal with its pulse width changing in proportion to the input signal, a second pulse-width modulated signal with its pulse width changing in the opposite direction to the first pulse-width modulated signal in accordance with the input signal, and a differential pulse-width modulated signal with the pulse width corresponding to the difference between the pulse widths of the first and second pulse-width modulated signals, this differential pulse-width modulated signal being used as the actual modulated signal.

A driving unit according to this invention is arranged to control the on-state of the transistors by use of the differential pulse-width modulated signal.

Another pulse-width modulator of this invention is arranged to produce a first triangular wave signal, a second triangular wave signal resulting from inverting the first triangular wave signal relative to a reference voltage, a first gate signal resulting from comparing the input signal with the first and second triangular wave signals and from detecting from the compared signal the period in which the input signal is larger than any one of the first and second triangular wave signals, and a second gate signal resulting from detecting the period in which the input signal is smaller than any one of the first and second triangular wave signals, so that when the input signal is positive, a pulse-width modulated signal is produced by use of the first gate signal and that when the input signal is negative, another pulse-width modulated signal is produced by use of the second gate signal.

Another driving unit of this invention is arranged to control the on-state of a first transistor by the first gate signal and the on-state of a second transistor by the second gate signal.

Still another pulse-width modulator of this invention is arranged to produce a triangular wave signal, an inverted input signal resulting from inverting the input signal, a first compared signal resulting from comparing the input signal and the triangular wave signal, a second compared signal resulting from comparing the inverted input signal and the triangular wave signal, a first gate signal resulting from detecting from the first and second compared signals the period in which the input signal is larger than the triangular wave signal and the inverted input signal is smaller than the triangular wave signal, and a second gate signal resulting from detecting the first and second compared signals the period in which the input signal is smaller than the triangular wave signal and the inverted input signal is larger than the triangular wave signals, so that when the input signal is positive, a pulse width modulated signal is produced by use of the first gate signal and that when the input signal is negative, another pulse-width modulated signal is produced by use of the second gate signal.

Still another driving unit of this invention is arranged to control the on-state of a first transistor by the first gate signal and the on-state of a second transistor by the second gate signal.

Thus, according to this invention, the insensitive zone and the discontinuous characteristic can be prevented from occurring in the relation of the input signal and the pulse-width of the pulse-width modulated signal or in the relation of the input signal and the drive current Ia, and hence a correct pulse-width modulated signal can be produced. That is, the pulse-width modulator can operate precisely, and the driving unit using it can operate with high accuracy and small power consumption. When this invention is applied to the actuator driving circuit or the like of optical recording and/or reproducing apparatus, the power consumption in the apparatus is small, and the insensitive zone can be prevented from occurring to deteriorate the control precision or the discontinuity characteristic can be prevented from occurring to make the control system unstable.

BRIEF DESCRIPTION OF THE DRAWINGS

FIG. 6 is a waveform diagram of waves at each portions of the arrangement of FIG. 1 in the case where an off-set occurs in the triangular wave signal S9 when the input signal S1 is negative;

FIG. 8 is a waveform diagram of waves showing the relations of the response speed of the comparators 9, 10 in FIG. 1 and each portions of the arrangement of FIG. 1;

DESCRIPTION OF THE PREFERRED EMBODIMENTS

Figure 1:
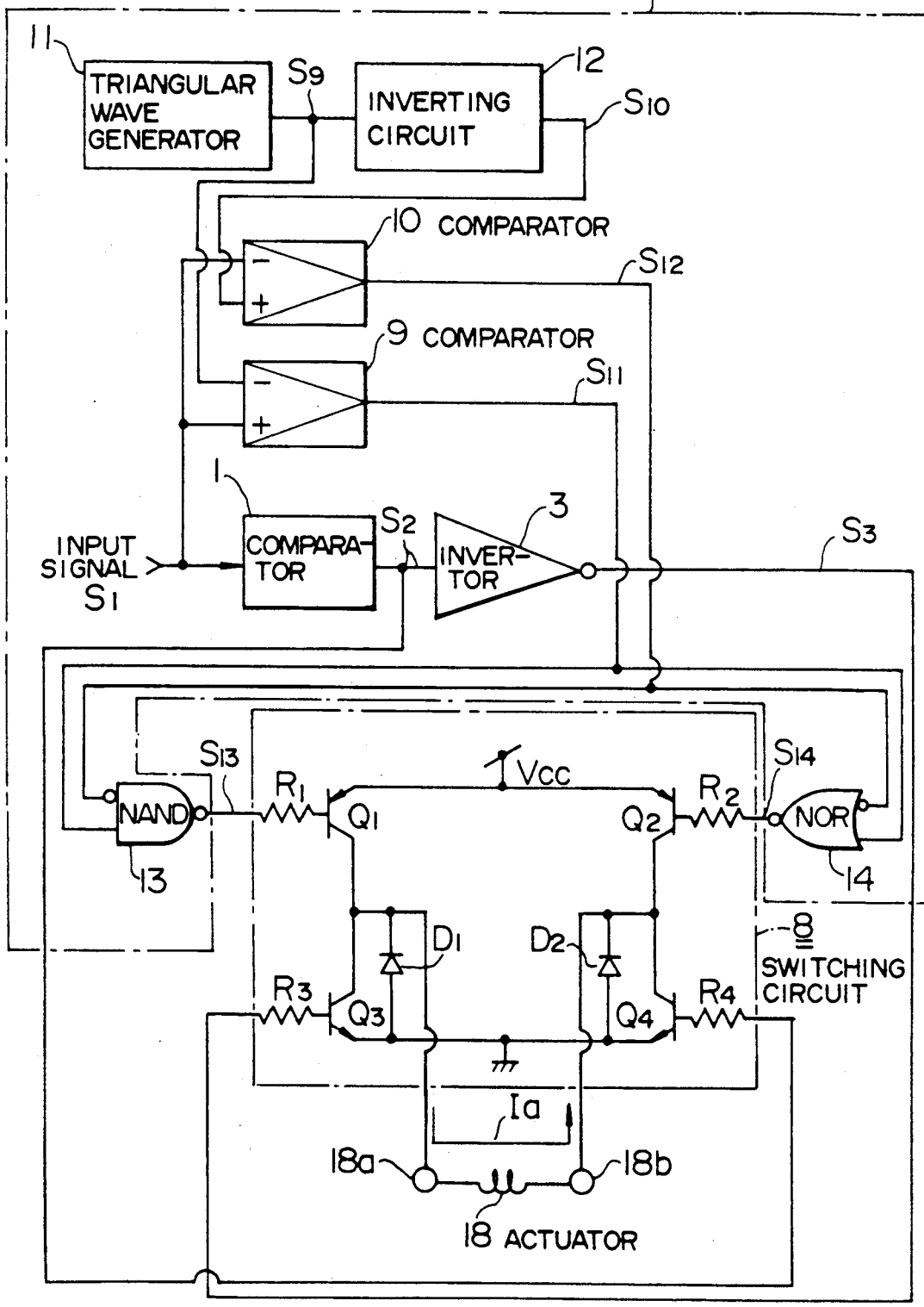
FIG. 1 shows an arrangement of one embodiment of a pulse-width modulator and a driving unit using the same according to this invention.
Figure 2:
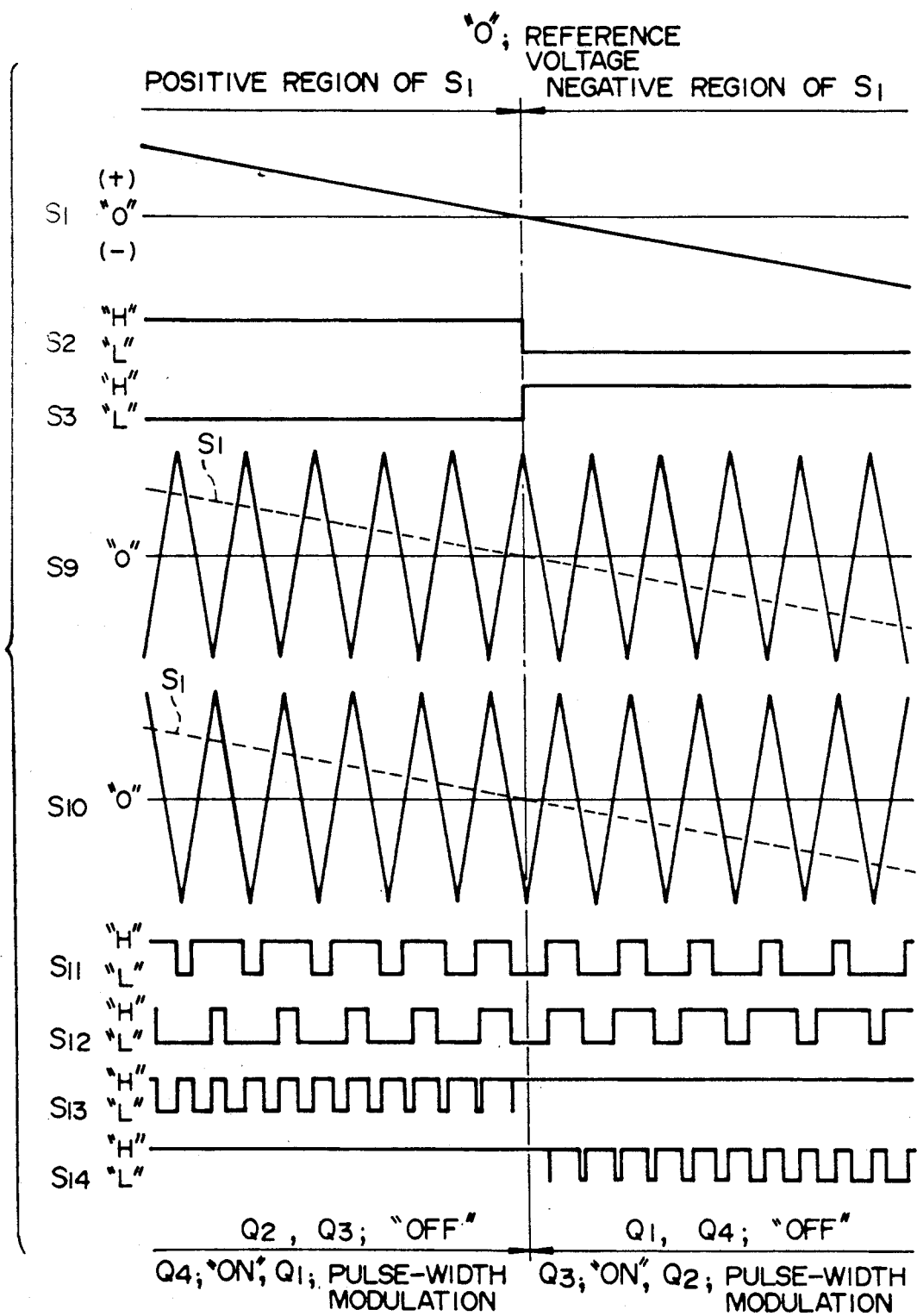
FIG. 2 is a waveform diagram of waves at each portions of the arrangement of FIG. 1.

FIG. 1 shows an arrangement of one embodiment of a pulse-width modulator and driving unit using the same according to this invention, and FIG. 2 is a waveform diagram of waves at each portions of the arrangement of FIG. 1. In the following figures, like elements corresponding to those in the conventional example are indentified by the same reference numerals.

Now, referring to FIG. 1, there is shown a pulse-width modulator 19 which includes the comparator 1, the invertor 3, a comparator 9, a comparator 10, a triangular wave generation circuit 11, an inverting circuit 12, and NAND gate 13, and a NOR gate 14. This pulse-width modulator 19 and the switching circuit 8 constitute a driving unit.

As illustrated in FIG. 1, the input signal S1 is supplied to the comparator 1, the non-inverting input end of the comparator 9 and the inverting input end of the comparator 10. The comparator 1 and the invertor 3 respectively produce the signals S2 and S3 for discriminating the polarity of the input signal S1 as in the conventional example of FIG. 12. The comparator 9 is also supplied at its inverting input end with the first triangular wave signal S9 which, as shown in FIG. 2 is substantially symmetrical with respect to the "0" level, from the triangular wave generation circuit 11. This signal S9 is also supplied to the inverting circuit 12 to produce therefrom a second triangular wave signal S10 (hereinafter, called the inverted triangular wave signal) resulting from inverting the signal S9 relative to the "0" level, as shown in FIG. 2. This signal S10 is supplied to the non-inverting input end of the comparator 10. When the input signal S1 shown in FIG. 2 is larger than the triangular wave signal S9, the comparator 9 produces a digital signal S11 of level "H". When the input signal S1 shown in FIG. 2 is smaller than the digital signal S10, the comparator 10 produces a digital signal S12 of level "H". The signal S11 has equal durations of "H" and "L" when the signal S1 is "0" level, increases the duration of "H" when the signal S1 is positive and increases, and decreases the duration of "H" when the signal S1 is negative and decreases. Also, the signal S12 has equal duration of "H" and "L" when the signal S1 is "0", decreases the duration of "H" when the signal S1 is positive and increases, and increases the duration of "H" when the signal S1 is negative and decreases.

Thus, the signals S11 and S12 are two pulse-width modulated signals with different phases of which the pulse widths change in the opposite directions with the change of the input signal S1, and become equal when the input signal S1 is "0" level.

The pulse-width modulator according to this invention produces such two pulse-width modulated signals of different phases as the signals S11 and S12 relative to the input signal, an further produces a differential pulse-width modulated signal which is the difference between the pulse widths of the two signals of different phases. This differential pulse-width modulated signal is used as the actual modulated signal.

Thus, the signals S11 and S12 are, respective, supplied to the NAND gate 13 with an inverting input end and the NOR gate 14 with an inverting input end. The NAND gate 13 produces a signal S13 which, as shown in FIG. 2, has "L" level when the signals S11 and S12 are, respectively, "H" and "L", or in the period corresponding to the difference between the pulse widths of "H" of the signals S11 and S12. The NOR gate 14 produces a signal S14 which, as shown in FIG. 2, has "L" level when the signals S11 and S12 are, respectively, "L" and "H", or in the period corresponding to the difference between the pulse widths of "L" of the signals S11 and S12.

The signals S13 and S14 have the pulse widths of "L" modulated. The signal S13 has the pulse width proportional to the signal S1 when the input signal S1 is positive, but no pulse when the signal S1 is negative, that is, the signal S13 is a pulse-width modulated signal only for the positive region of the input signal. On the contrary, the signal S14 has the pulse width proportional to the negative level of the signal S1 when the signal S1 is negative, but no pulse when the signal S1 is positive, that is, the signal S14 is a pulse-width modulated signal only for the negative region of the input signal.

Moreover, the signal S13 has the pulse width of "L" level when the input signal S1 is larger than the triangular wave signal S9 and larger than the inverted triangular wave signal S10. The signal S14 has the pulse width of "L" level when the input signal S1 is smaller than the triangular wave signal S9 and smaller than the inverted triangular wave signal S10.

Figure 12:
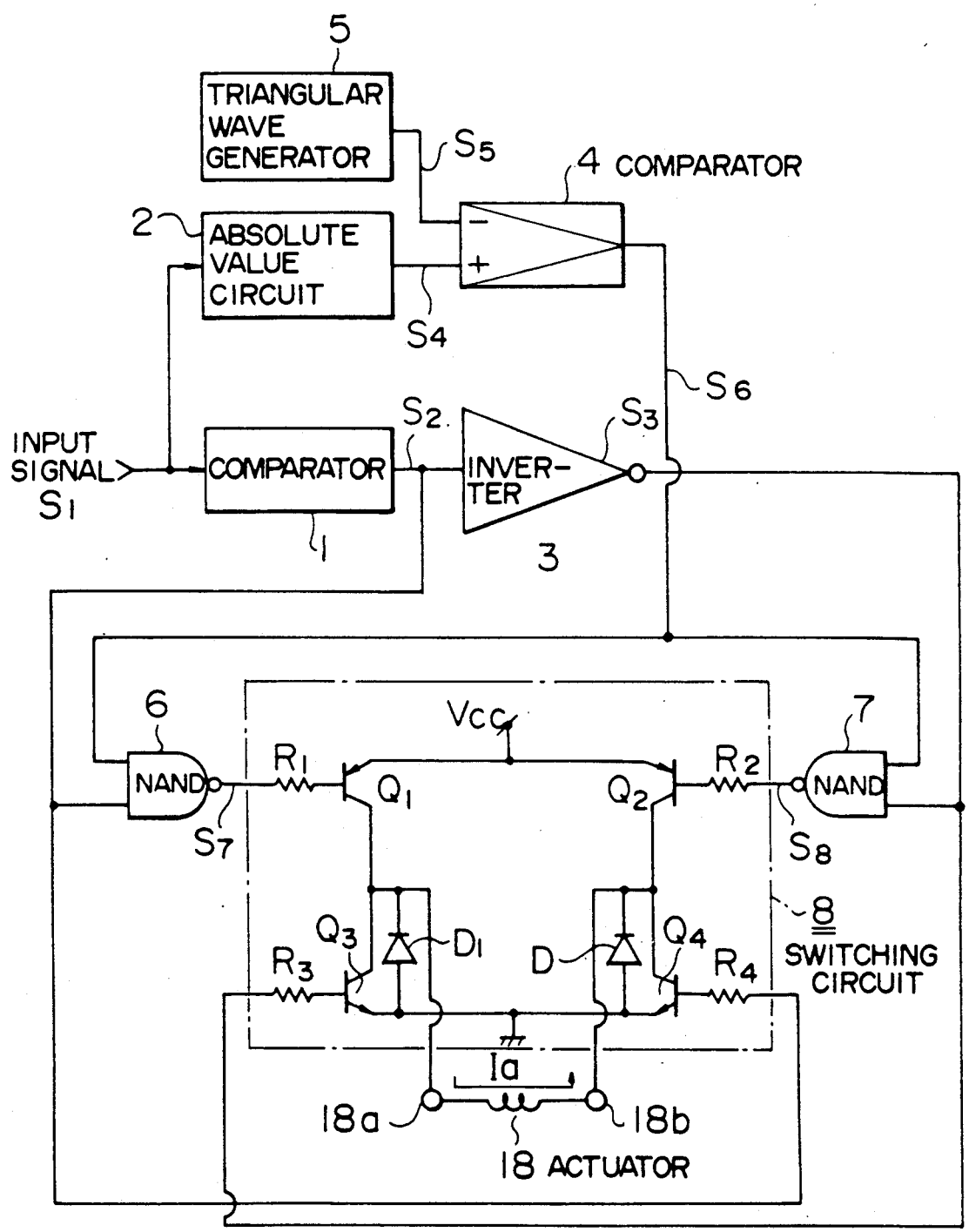
FIG. 12 shows an arrangement of a conventional pulse-width modulator and driving unit using the modulator.
Figure 13:
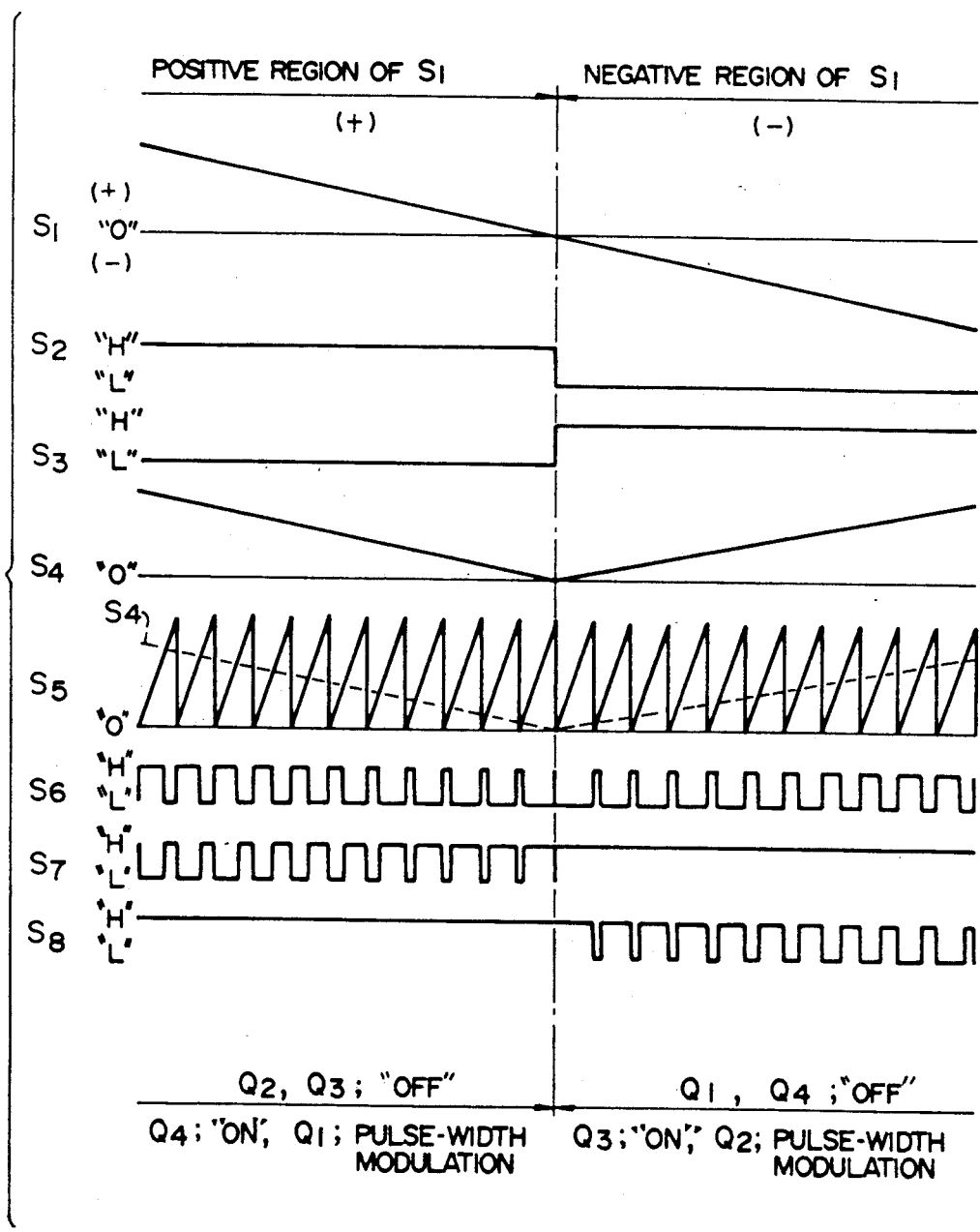
FIG. 13 is a waveform diagram of waves at each portions of the arrangement of FIG. 12.

The signals S13 and S14 and the signals S2 and S3 are supplied to the same switching circuit 8 as shown in FIG. 12.

Figure 14A:
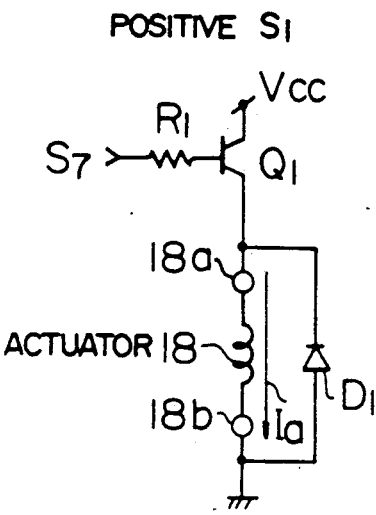
FIGS. 14(a) and 14(b) show equivalent circuits of the switching circuit in FIG. 12.
Figure 14B:
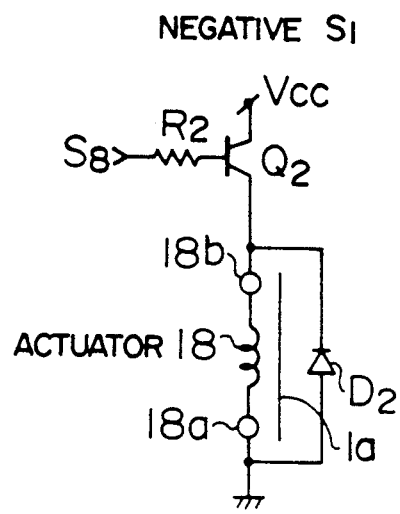

In the switching circuit 8, as in the conventional example of FIG. 12, the signal S3 is supplied to the base of the transistor Q3 through the resistor R3, the signal S2 to the base of the transistor Q4 through the resistor R4, the signal S13 to the base of the transistor Q1 through the resistor R1, and the signal S14 to the base of the transistor Q2 through the resistor R2. When the signal S1 is positive, the transistors Q2 and Q3 are both in the off-state and the transistor Q4 is in the on-state, thus, the switching circuit 8 corresponding to the equivalent circuit of FIG. 14a in which the signal S7 is replaced by signal S12. When the signal S1 is negative, the transistors Q1 and Q4 are both in the off-state, and the transistor Q3 is in the on-state. Thus, the switching circuit 8 corresponds to the equivalent circuit of FIG. 14b in which the signal S8 is replaced by the signal S14.

Figure 15:
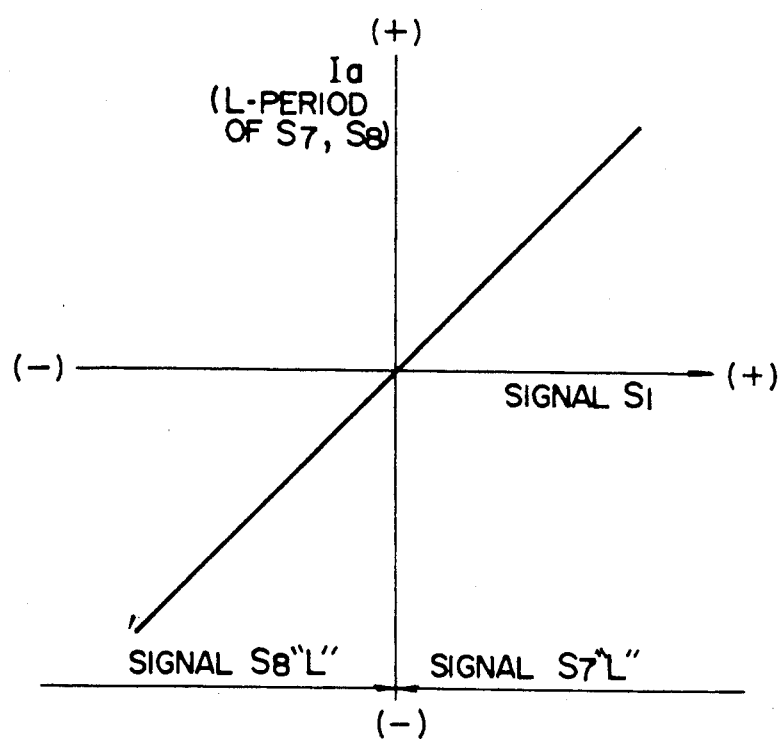
FIG. 15 is a graph showing the relation between the input signal S1 and the drive current Ia in FIG. 13.
Figure 16:
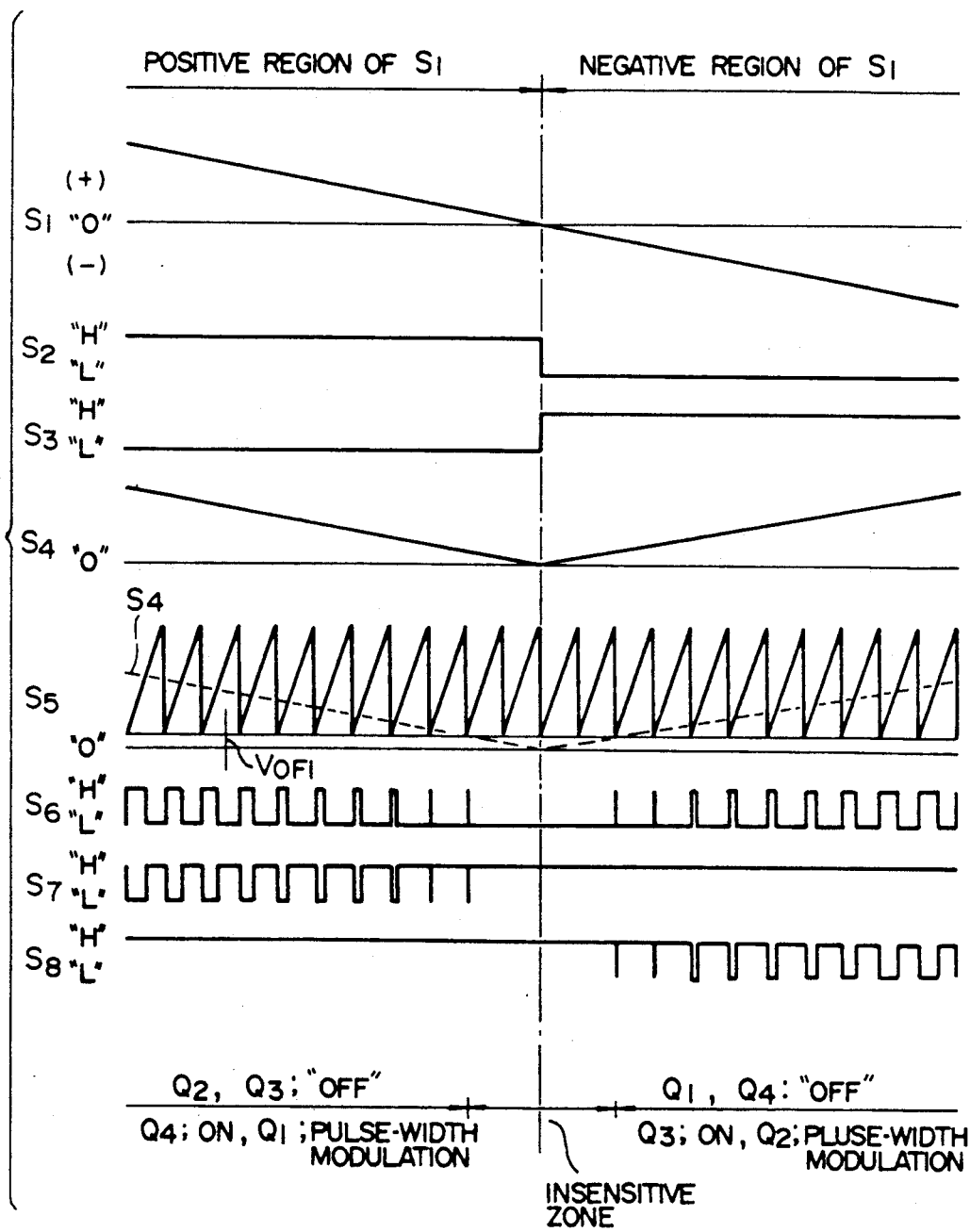
FIG. 16 is a waveform diagram of waves at each portions of the arrangement of FIG. 12 in the case where a positive off-set occurs int eh triangular wave signal S5 in FIG. 12.
Figure 17:
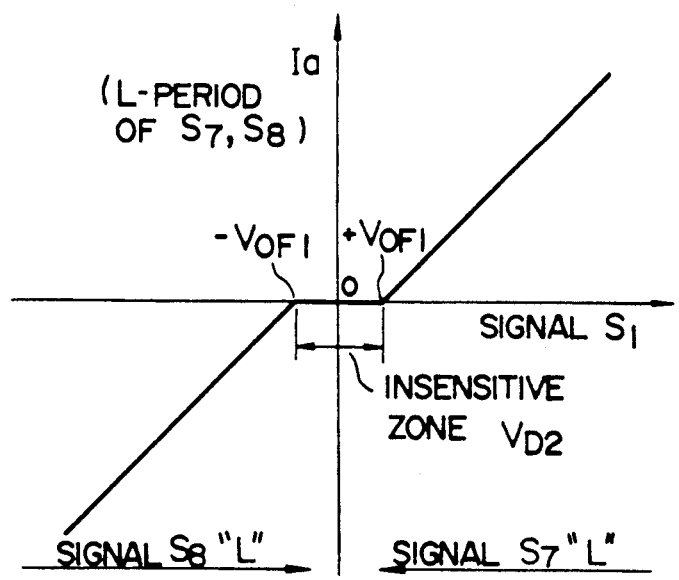
FIG. 17 is a graph showing the relation between the input signal S1 and the drive current Ia in FIG. 16.
Figure 18:
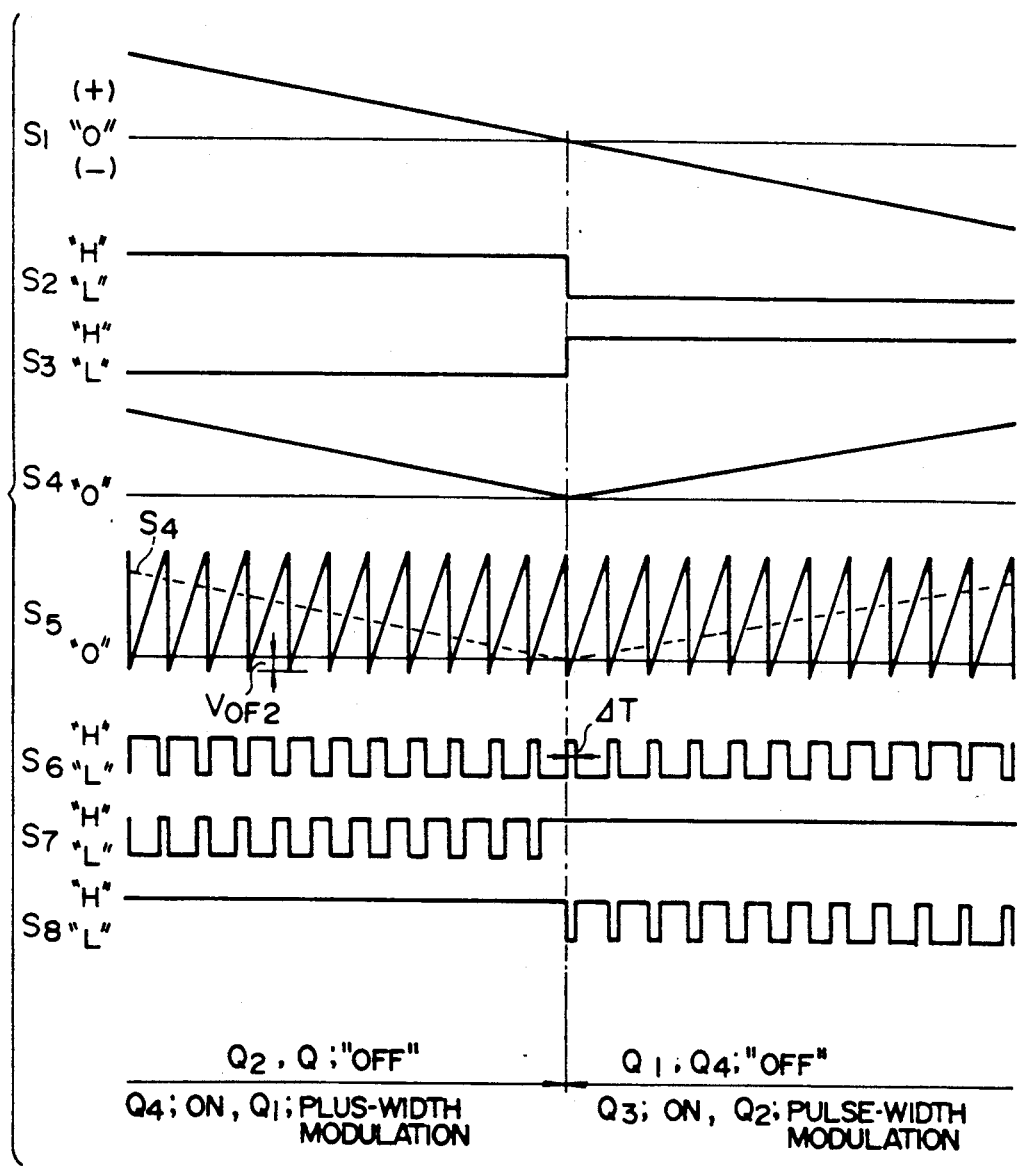
FIG. 18 is a waveform diagram of waves at each portion of the arrangement of FIG. 12 in the case where a negative off-set occurs in the triangular wave signal S5 in FIG. 12.
Figure 19:
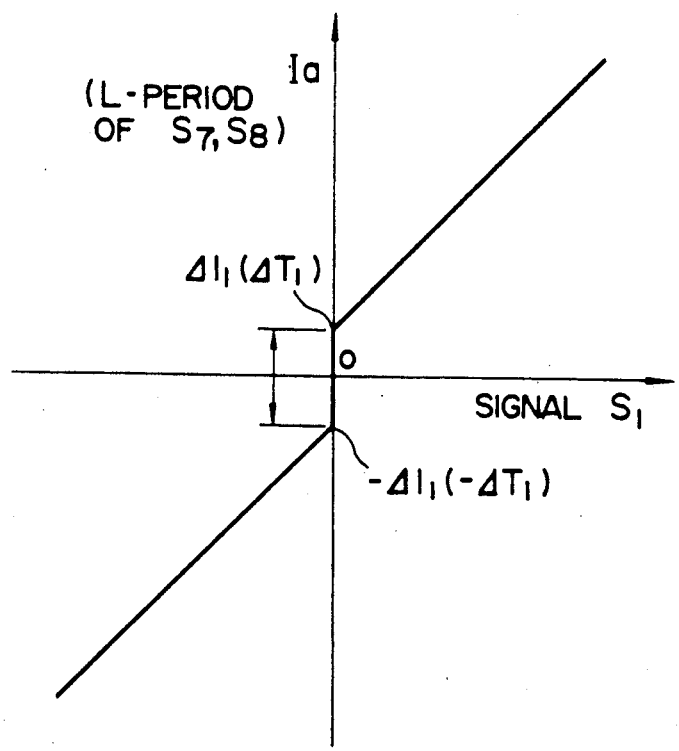
FIG. 19 is a graph showing the relation between the input signal S1 and the drive current Ia in FIG. 18.

Thus, the current Ia flowing in the actuator 18 is proportional to the input signal S1 as in FIG. 15.

Figure 3:
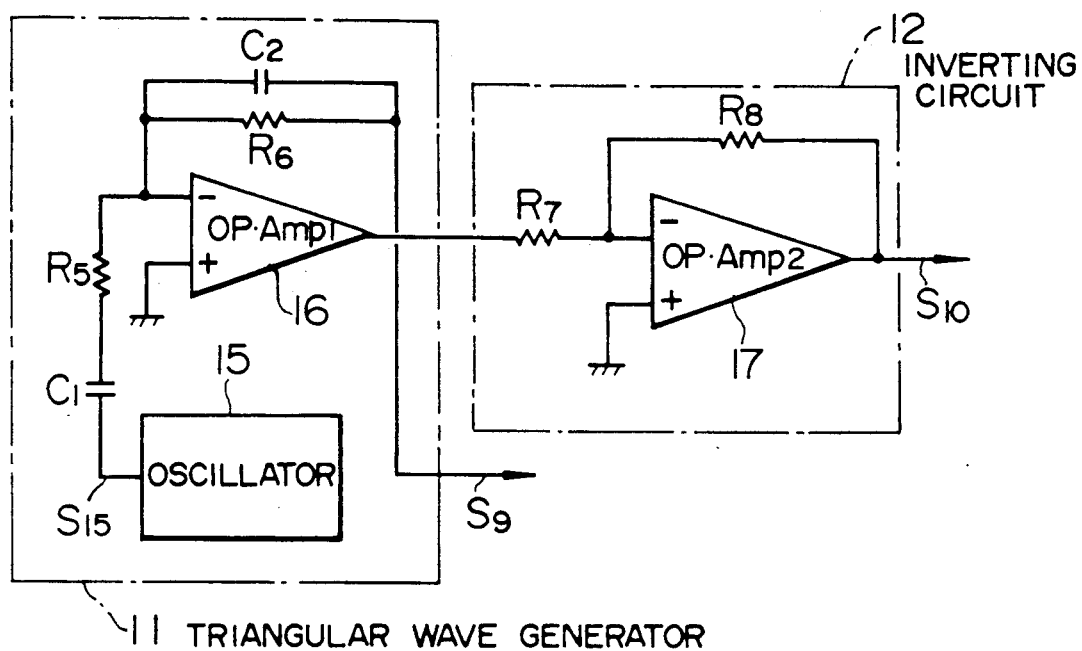
FIG. 3 shows an arrangement of a triangular wave generation circuit 11 in FIG. 1.
Figure 4:
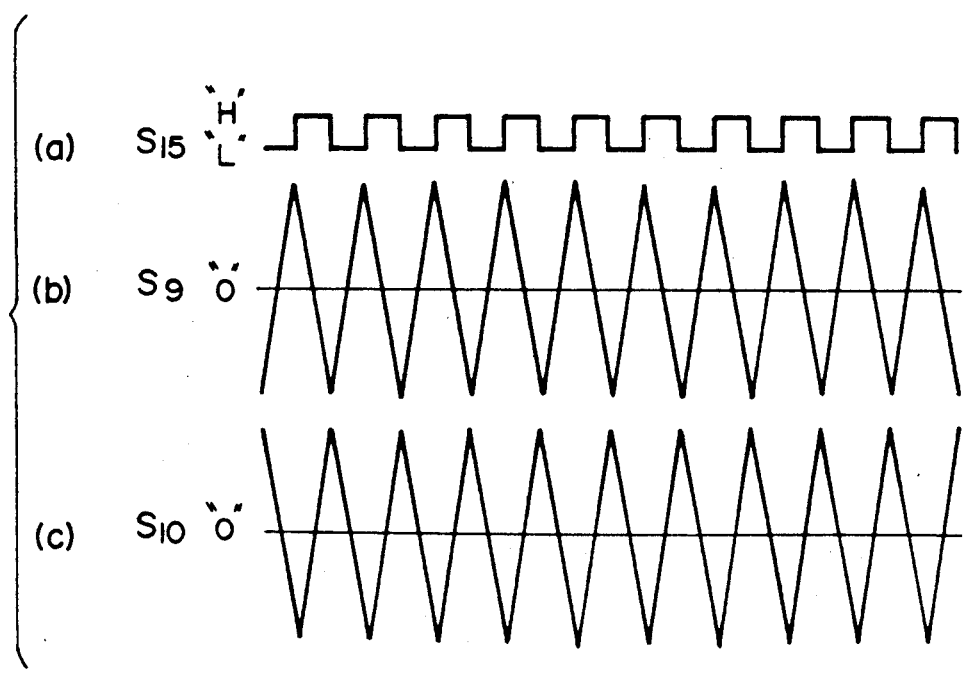
FIG. 4 is a waveform diagram of waves at each portions of the arrangement of FIG. 3.

In this invention, the triangular wave signal S9 and the inverted triangular wave signal S10 can be produced from the circuit shown in FIG. 3. FIGS. 4a, 4b and 4c show waveforms at each portions of the arrangement of FIG. 3. Referring to FIG. 3, an oscillator 15 produces a rectangular wave signal S15 of equal durations of "H" and "L", or 50-% duty factor. This signal is supplied through a capacitor C1, so that the DC voltage is removed form the signal S15. Then, the signal from the capacitor is supplied to a well-known Miller integration circuit which is formed of an operational amplifier 16, resistors R5 and R6 and a capacitor C2. The Miller integration circuit produces the triangular wave signal S9 which rises in the "L" period of the signal S15 and falls in the "H" period thereof. The signal S9 is supplied to the inversion circuit 12 which is formed of an operational amplifier 17 and resistors R7 and R8. Thus, the inverting circuit produces the inverted triangular signal S10. The offset in the operational amplifier is normally very low and easy to be suppressed to, for example, 1 mv or below. Therefore, the inverting circuit 12 is able to invert the signal S9 precisely with a small off-set relative to the "0" level (which is the potential of ground in FIG. 3).

Figure 5A:
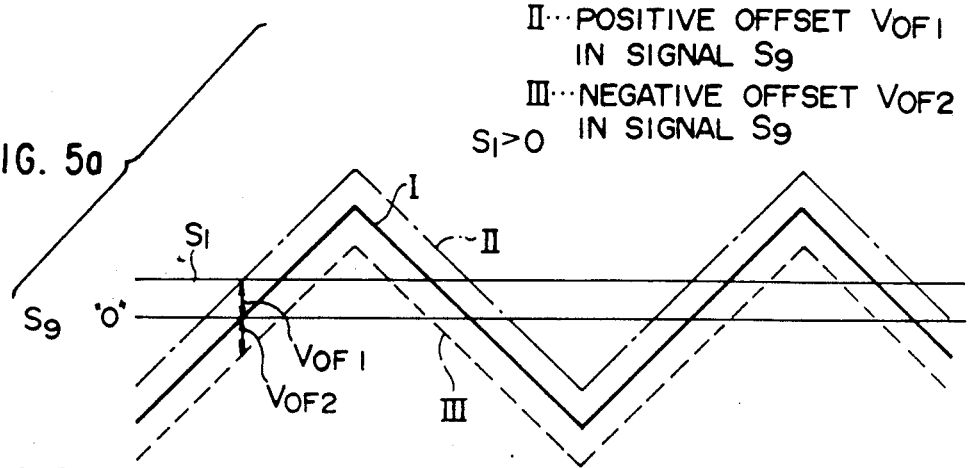
FIG. 5 is a waveform diagram of waves at each portions of the arrangement of FIG. 1 in the case where an off-set occurs in a triangular wave signal S9 when the input signal S1 is positive.
Figure 5B:
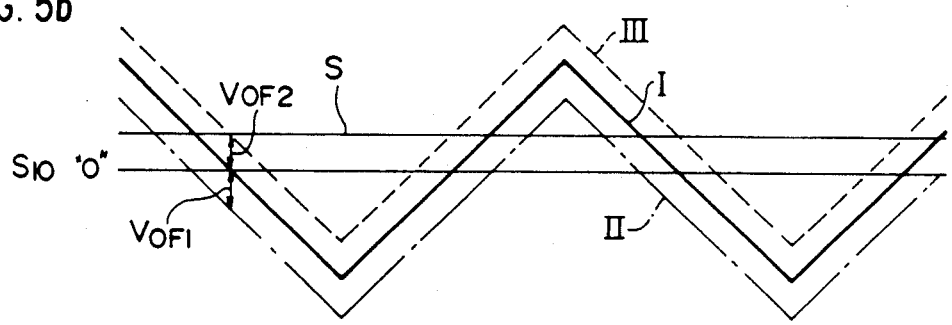
Figure 5C:
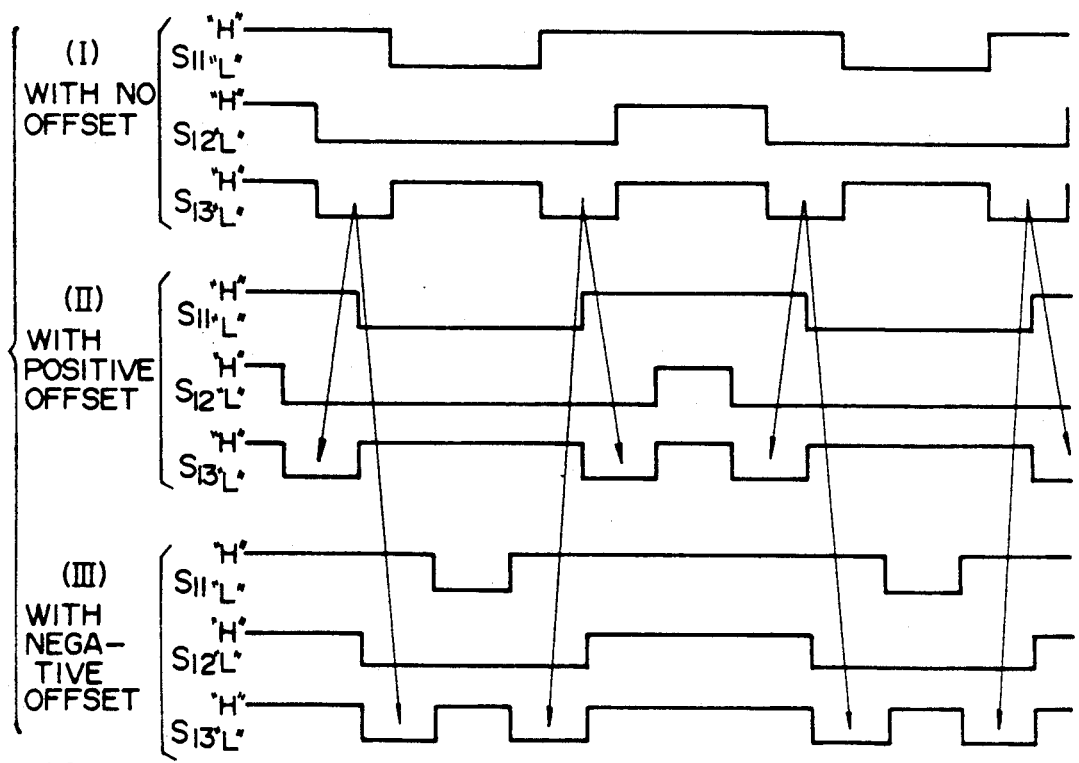

With reference to FIGS. 5 and 6, description will be made of the case where an off-set voltage is caused in the triangular wave signal S9 in this invention. The time base of each signal waveform in FIGS. 5 and 6 is shown more exaggeratingly than in FIG. 2. FIG. 5 shows the waveform for the positive voltage of the signal S1. In FIG. 5, for the signal S9 the solid line, I indicates the waveform of the signal S9 with no off-set, the one-dot chain line, II indicates the waveform of the signal S9 with an off-set voltage of only Vof1 in the positive direction, and the broken line, III indicates the waveform of the signal S9 with an off-set voltage of only Vof2 in the negative direction. In FIG. 5, for the signal S10 the solid line, I indicates the waveform of the signal S10 in the case where the signal S9 has no off-set, the one-dot chain line, II indicates the waveform of the signal S10 in the case where the signal S9 has only Vof1 in the positive direction, and the broken line, III indicates the waveform of the signal S10 in the case direction, and where the signal S9 has an off-set of only Vof2 in the negative direction. In FIG. 6, the lines I, II, III, indicate the same as those in FIG. 5. When the signal S9 is as indicated by the one-dot chain line II, the off-set voltage is also inverted by the inverting circuit 12 so that the signal S10 has an off-set voltage of Vof1 in the opposite direction to the signal S9, or in the negative direction. When the signal S9 is as indicated by the broken line III, the signal S10 has an off-set voltage of Vof2 in the opposite direction to the signal S9, or in the positive direction. Therefore, the signals S11, S12 and S13 have such waveforms as shown by I, II, III, on the lower side of FIG. 5. From the waveforms, it will be seen that the modulated signal S13 for each case is not changed in the pulse width of "L" level but is only shifted in the time base of the "L" period indicated by the arrows. In FIG. 5, the signal S14, though not shown, is always of "H" level. Moreover, FIG. 6 shows the waveforms relative to the signal S1 of negative voltage. In FIG. 6, similarly the modulated signal S13 for each case I, II, III, is not changed in the pulse width but is only shifted in the time base as indicated by the arrows. In FIG. 6, the signal S14, though not shown, is always of "H" level.

Figure 7A:
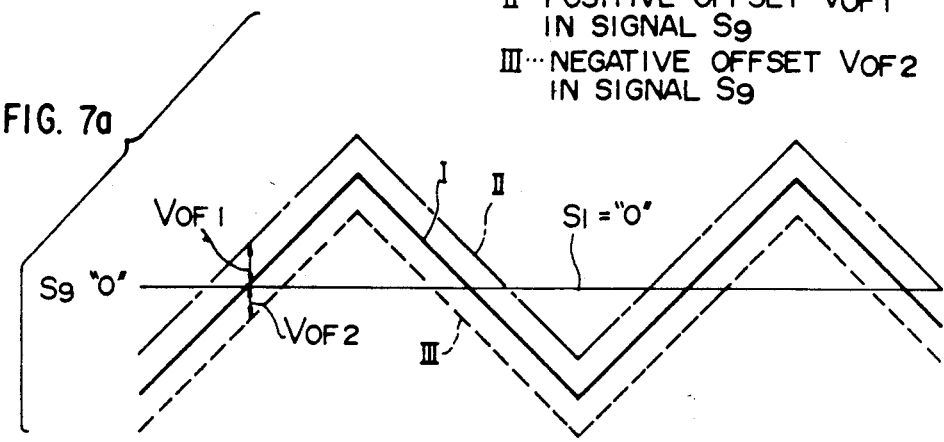
FIG. 7 is a waveform diagram of waves at each portions of the arrangement of FIG. 1 int he case where an off-set occurs int eh triangular wave signal S9 when the input signal S1 is "0" level.
Figure 7B:
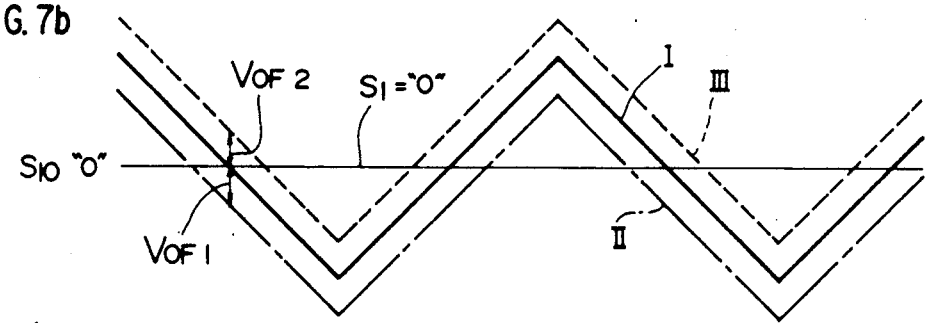
Figure 7C:
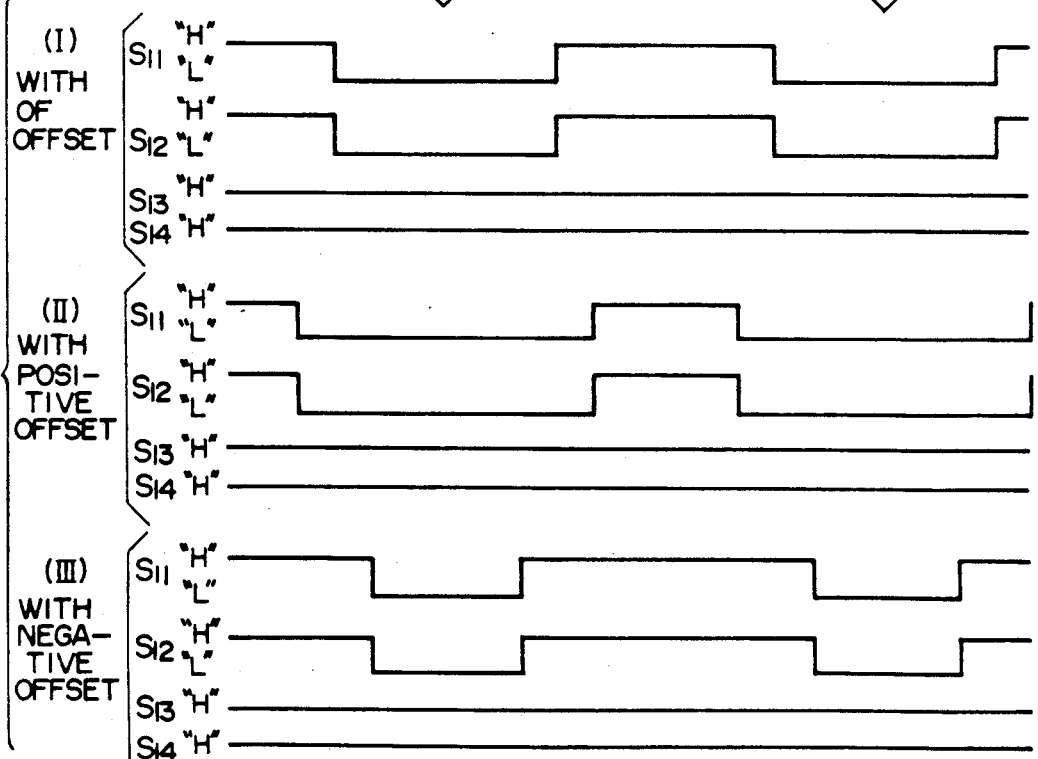

FIG. 7 shows the waveforms relative to the signal S1 of "0" level. In this case, since both the signals S11 and S12 are changed in the pulse width by the off-set voltage of the signal S9, but always equal in the pulse width, the modulated signals S13 and S14 are always of "H" level. Thus, according to the pulse widths of the modulated signals S13 and S14 and the drive current Ia are not changed by the off-set of the triangular wave signal S9, but are proportional to the input signal, and there are not produced such insensitive zone and the discontinuous characteristic as in the prior art.

Now, we will consider the response times of the comparators 9 and 10, or the presence of the difference between the rise time, tr and the fall time, tf of signals S11, S12.

FIG. 8 shows the waveforms of signals S11, S12, S13 in each of the conditions (I) tr=tf=0, (II) tr>tf>0, (III) tf>tr>0, and when the rise times tr of the comparators 9 and 10 are equal, and the fall times thereof are similarly equal under the condition that the signal S1 is positive.

The comparators 9 and 10 in FIG. 1 can be constructed in the same circuit, and the response times such as tr and tf can be achieved to be close. Particularly, when these circuits are formed in the same integrated circuit chip, most characteristics including the response time, of the circuits are extremely similar.

In FIG. 8, when the condition II is compared with condition I, the pulse widths of signals S11, S12 are narrowed by the same amount. When the condition III is compared with the condition I, the pulse widths of signals S11 and S12 are widened by the same amount. Although in conditions II, III the pulse widths of signals S11 and S12 are changed as compared with condition I, those of the modulated signals S13, S14 are not changed, but the positions where they occur are only changed on the time base as indicated by signal S13 in FIG. 8.

Therefore, if the comparators 9 and 10 are formed close to each other and in the same shape to be preferably of the same circuit construction on one integrated circuit chip so that the response times (tr, tf) are extremely close to each other, then the pulse widths of the pulse-width modulated signals and the drive current Ia are not affected by the response times (tr, tf), but are proportional to the input signal.

Another preferred embodiment of this invention will be described below.

Figure 9:
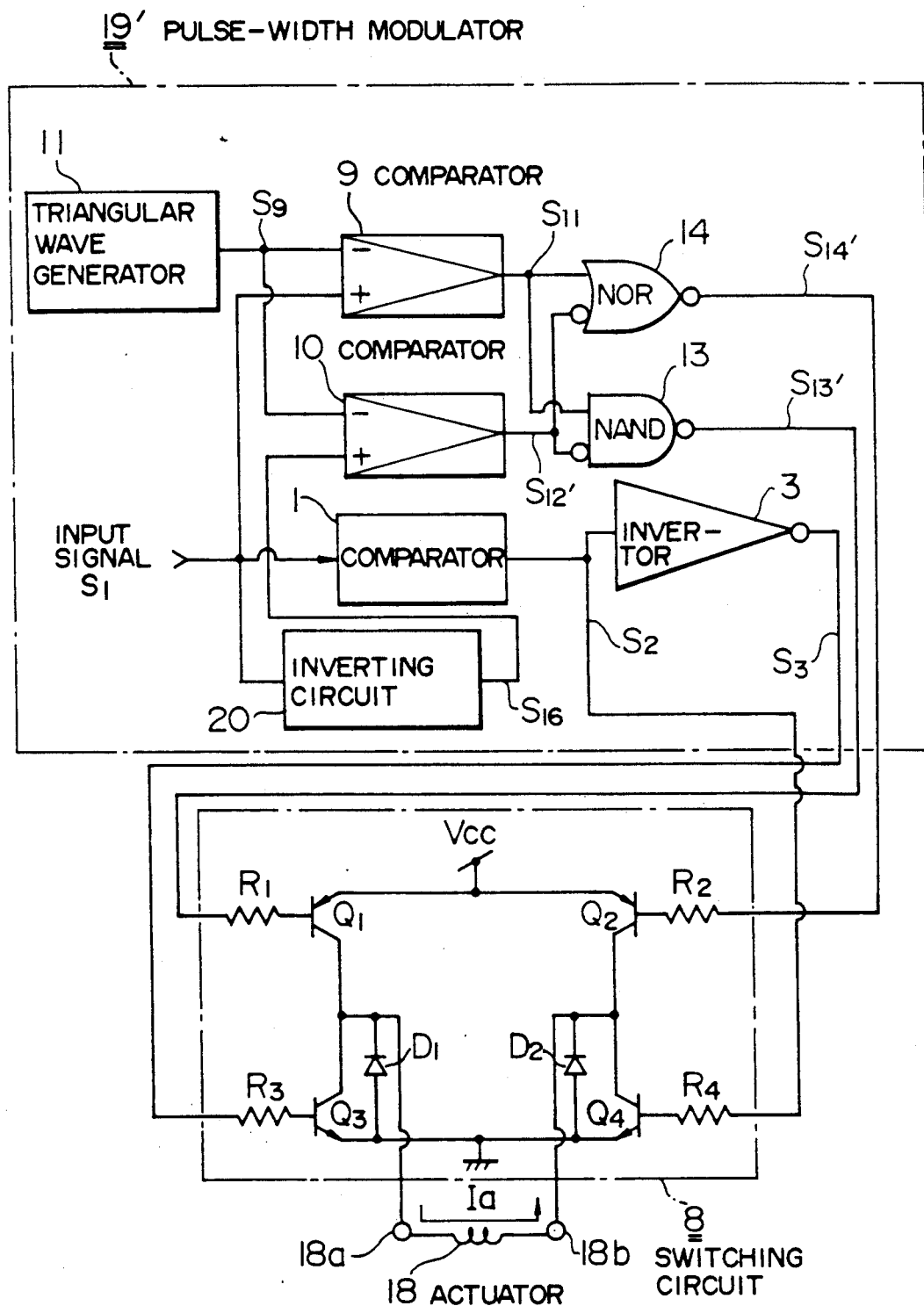
FIG. 9 shows an arrangement of another embodiment of a pulse-width modulator and a driving unit using it according to this invention.
Figure 10:
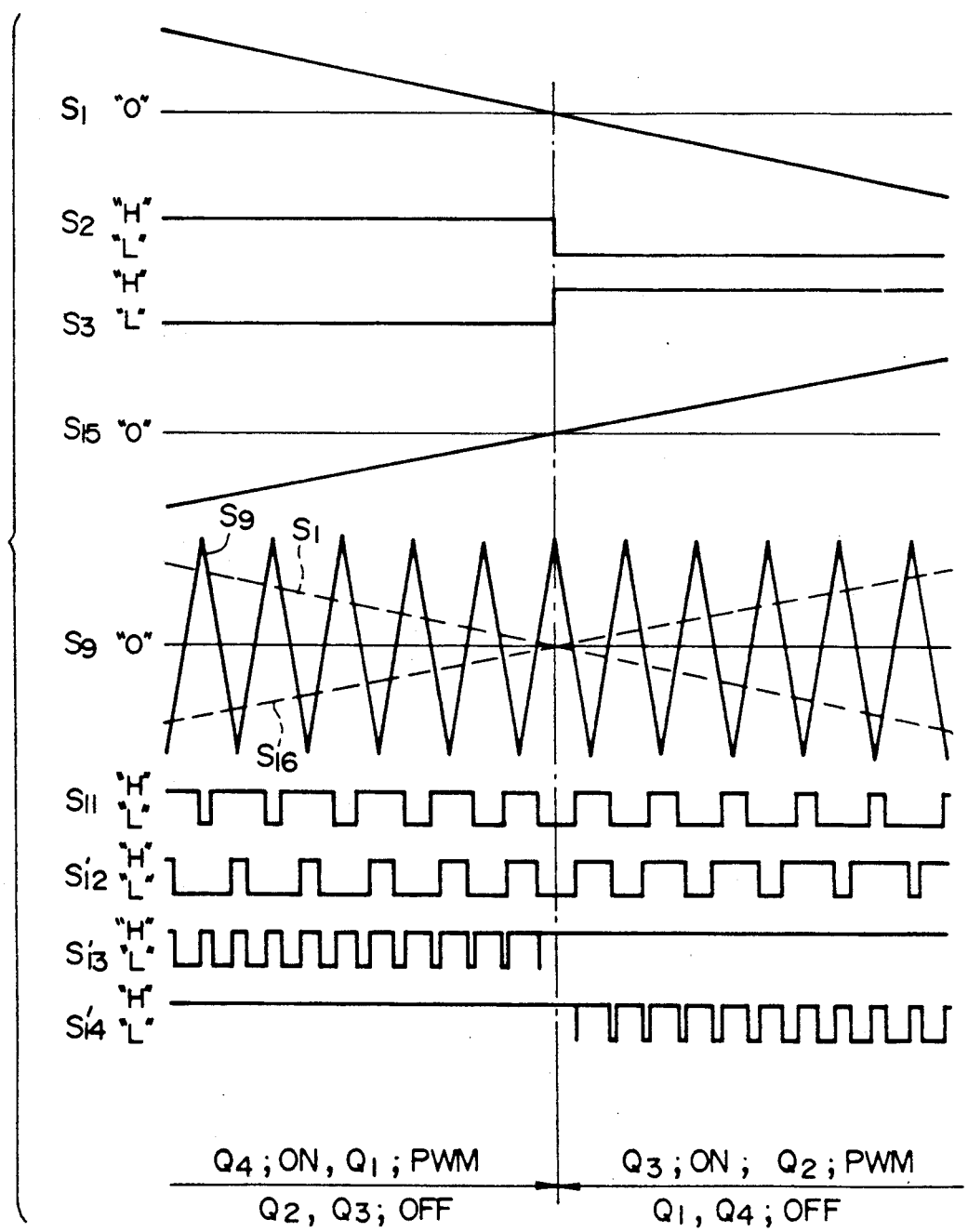
FIG. 10 is a waveform diagram of waves at each portions of the arrangement of FIG. 9.

FIG. 9 shows the arrangement of another embodiment of a pulse-width modulator and driving unit using the same according to this invention. FIG. 10 is a waveform diagram of waves at each portions of the arrangement of FIG. 9. In the following drawings, like elements as those in teh conventional example or in FIGS. 1 and 2 are identified by the same reference numerals and characters.

In FIG. 9, the comparator 1, the invertor 3, the triangular wave generation circuit 11, the comparator 9, the comparator 10, an inverting circuit 20, the NAND gate 13, adn the NOR gate 14 constitute a pulse-width modulator 19'. This pulse-width modulator 19' and the switching circuit 8 constitute a driving unit.

In FIG. 9, the input signal S1 is supplied to the comparator 1, the non-inverting input end of hte comparator 9, and the inverting circuit 20. The triangular wave signal S9 from the triangular wave generation circuit 11 is supplied to the inverting input end of the comparator 9 adnthe inverting input end of the comparator 10. The comparator 1 and the invertor 3 produce the signals S2 and S3 for discriminating the polarity of the input signal S1 in the same way as in FIG. 2. The inverting circuit 20 inverts the input signal S1 relative to "0" level to produce an input inverted signal S16. This signal S16 is supplied to the non-inverting input end of the comparator 10.

The comparator 9 compares the levels of the signal S9 and the input signal S1 to produce the signal S11 which becomes 'H' when the input signal S1 is larger than the triangular wave signal S9, as in FIG. 2. The comparator 10 compares the levels of the triangular wave signal S9 and the input inverted signal S16 to produce a signal S12' which becomes "H" when the signal S16 is larger than the signal S9.

The arrangement of FIG. 9 is different from that of FIG. 1 in that the signals to be compared are different in the respective comparators 10. In FIG. 1, the input signal S1 is supplied to the inverting input end of the comparator 10, and the signal S10 resulting from inverting the triangular wave signal S9 is supplied to the non-inverting input thereof, so that the output signal S12 is produced therefrom as a result of level comparison. On the other hand, in FIG. 9, the input inverted signal S16 resulting from inverting the input signal S1 is supplied to the non-inverting end of the comparator 10, and the triangular wave signal S9 is supplied to the inverting input end thereof, so that the output signal S12' is produced therefrom. Despite the difference of the construction, the signals S11 and S12' produced from the comparators 10 are equivalent. The signals S11 and S12' are, respectively supplied to the inverting input ends of the NAND gate 13 and NOR gate 14 in the same way as in FIG. 1. The output signals S13', S14' are equivalent to the signals S13, S14 shown in FIG. 2.

As illustrated in FIG. 10, the signal S13' has a pulse "L" level in the period in which the input signal S1 is larger than the triangular wave signal S9 and the input inverted signal S16 is smaller than the signal S9. Also, the signal S14' has a pulse width of "L" level in the period in which the input signal S1 is smaller than the triangular wave signal S9 and the input inverted signal S16 is larger than the triangular wave signal S9.

The signals S13', S14', S2 and S3 are supplied to the same switching circuit 8 as shown in FIG. 1.

In FIG. 8, in the same way as in FIG. 1, the signal S2 is supplied through the resistor R4 to the base of the transistor Q4, the signal S3 is supplied through the resistor R3 to the base of the transistor Q3, the signal S13' is supplied through the resistor R1 to the base of the transistor Q1, and the signal S14' is supplied through the resistor R2 to the base of the transistor Q2.

In FIG. 9, the signals S13', S14', S2 and S3 make the same action to the switching circuit 8 as the signals S13, S14, S2 and S2 in FIG. 1.

The embodiment shown in FIG. 9 can provide a pulse-width modulator and driving unit using the same which are able to properly operate without the effect of the off-set of the triangular wave signal S9 and the response times of the comparator 9 and the comparator 10 similarly to the arrangement of FIG. 1.

Figure 11:
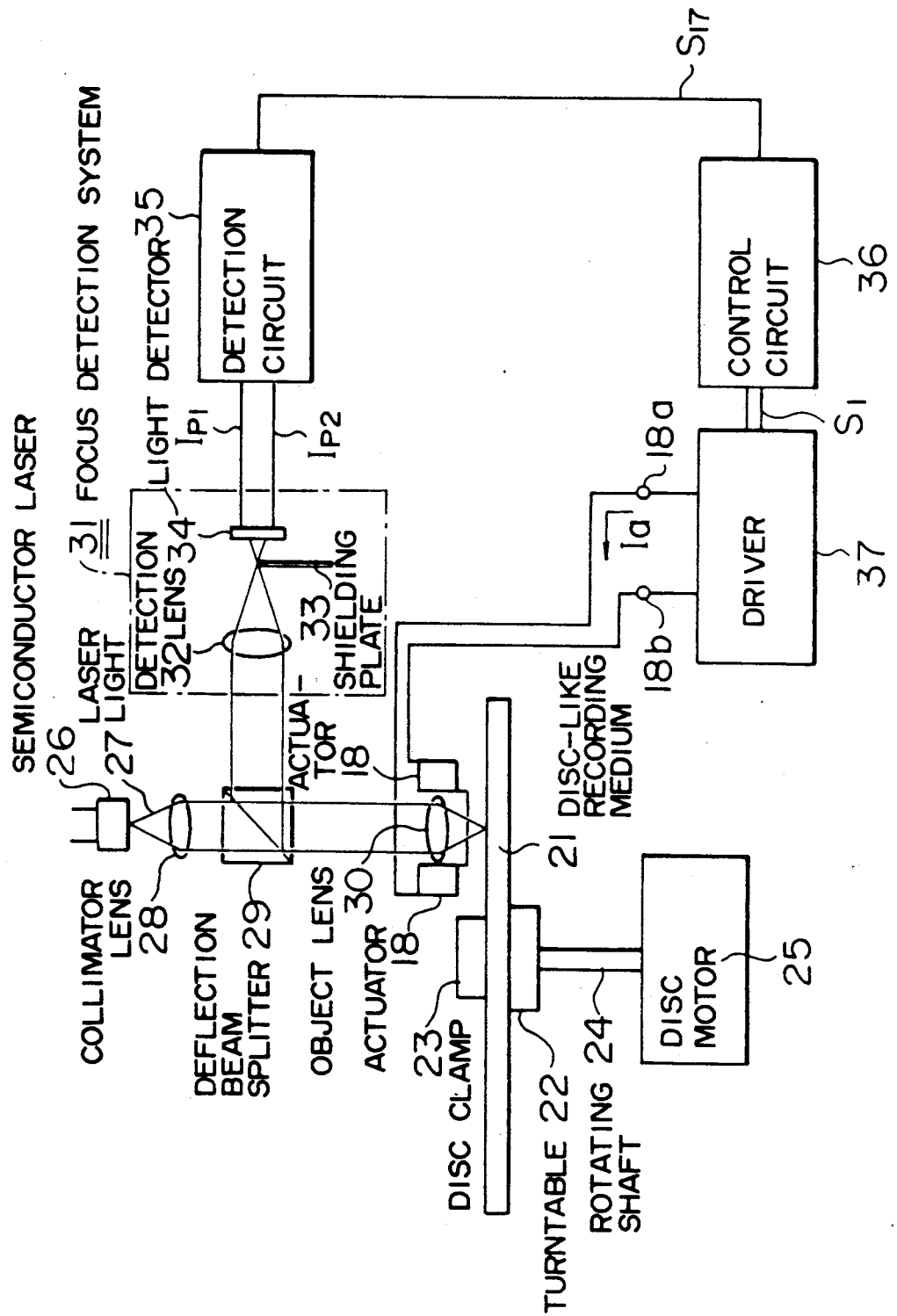
FIG. 11 shows an arrangement of an optical disc player in which the driving unit of this invention is used for driving its actuator.

FIG. 11 is a block diagram of the focus control system of an optical recording and reproducing apparatus in which the control unit of this invention is used.

In FIG. 11, a disc like recording medium 21 is placed on a turntable 22 and fixed not to slip against each other by a disc clamp 23. The turntable 22 is directly driven by the rotating shaft, 24 of a disc motor 25 so that the disc-like recording medium 21 is rotated at a predetermined rate.

On the other hand, laser light 27 emitted from a semiconductor laser 26 is shaped into parallel light by a collimator lens 28, passed through a deflection beam splitter 29, and focused by an object lens 30 into a light spot on the disc-like recording medium 21. By the way, the disc-like recording medium 21 has surface fluctuation, by which the relative position of the object lens 30 to the disc-like recording medium is changed while the medium is rotating under the condition that the object lens is fixed in position. This follows that the light spot on the disc-like recording medium 21 is defocused, thus failing to make recording or reproducing. Therefore, the object lens 30 is required to be changed in position to follow the positional change of the disc-like recording medium 21 due to the surface fluctuation or the like, and thereby to control the light spot to always be focused on the disc-like recording medium by means of a focusing controller.

The light irradiated on the disc-like recording medium 21 is reflected therefrom back into the object lens 30 and reflected from the beam splitter 29 into a focus detection optical system 31 which is surrounded by a one-dot chain line. This focus detection optical system 31 may use, for example, a known knife edge method which comprises a detection lens 32, a shielding plate 33 having a knife edge placed near the detection lens 33, and a double-portion light detector 34 for detecting the light passed this shield-ing plate. This double-portion light detector 34 is formed of two light detectors 34a and 34b. When the light spot is in focus, the amount of light incident to each of the two detectors 34a and 34b is equal. When the light is out of focus on the disc-like recording medium 21, or when the light is focused on, for example, a point above the disc-like recording medium, the amount of light spot on the detector 34a increases, while the amount of the light spot on the detector 34b decreases. On the contrary, when the light is focused on a point below the disc-like recording medium 21, the amount of the light spot on the detector 34a decreases, while that on the detector 34b increases.

Therefore, the detectors 34a, 34b produce photocurrents Ip1, Ip2 of which the intensity is proportional to the amount of the light irradiation, and supply them to a detection circuit 35. This detection circuit produces a focus error signal S17 corresponding to the difference therebetween.

This focus error signal 17 is supplied to a control circuit 36, which amplifies or phase-compensates the input signal if necessary, to produce the signal S1. This signal S1 is supplied to a driver 37. The driver 37 is constructed as in FIG. 1 or 9, and its output terminals 18a and 18b are connected to the actuator 18. The actuator 18 permits the object lens 30 to move in the direction perpendicular to the surface of the disclike recording medium 21 in which case the displacement is proportional to the drive current Ia.

Accordingly, even if the disc-like recording medium 21 is displaced due to the surface fluctuation or the like, the amount of the displacement is detected as the focus error signal S17, and the actuator is controlled in its amount of displacement in accordance with the intensity of the signal so that the focus error signal S17 is always zero. As a result, the distance between the object lens 30 and the disc-like recording medium 21 is constant, and thus the light spot is focused on the surface of the disc-like recording medium.

The optical-type recording and/or reproducing apparatus requires not only this focus control system but also the tracking control system for permitting the light spot to trace the information track with high precision, or a traverse control system for permitting the whole optical head to move. In addition, each control system needs the actuator and the driver. The driving unit according to this invention can be applied not only to the driving of the actuator of the opticaltype recording and/or reproducing apparatus but also to, for, example, an acoustic-purpose power amplifier for driving a loud speaker. In other words, the driving unit can be applied to the system which requires small size, power saving and has high precision.

We claim:

1. A pulse width modulator comprising:
   a triangular wave generator circuit for generating a triangular wave signal, said triangular wave signal having a constant frequency;
   an inverting circuit for receiving and inverting said triangular wave signal;
   an input terminal adapted to receive an input signal;
   a first and a second comparator, said first comparator including one input connected to said input terminal and another input connected to an output of said inverting circuit and said second comparator including one input connected to said input terminal and another input receiving said triangular wave signal;
   a third comparator having an input connected to said input terminal and generating a first control signal, said first control signal being in a high state when said input signal is positive and in a low state when said input signal is negative;
   an invertor connected to said third comparator for inverting said first control signal to generate a second control signal;
   a NOR circuit including a first and a second input, said first input receiving an inverted output of said first comparator and said second input being connected to said second comparator, said NOR circuit generating a third control signal;
   a NAND circuit including a first and a second input, said first input of said NAND circuit receiving an inverted output of said first comparator and said second input of said NAND circuit being connected to said second comparator, said NAND circuit generating a fourth control signal;
   wherein said first, second, third and fourth control signals are adapted to control a plurality of transistors.

2. A pulse width modulator as in claim 1 wherein said first and second comparators are formed on one integrated circuit chip.

3. A modulator according to claim 1 in which:
   at least a first one of said transistors is controlled to be turned on and off in accordance with said fourth control signal output from said NAND circuit only when said input signal becomes higher than a reference voltage; and
   at least a second one of said transistors is controlled to be turned on and off in accordance with said third control signal output from said NOR circuit only when said input signal becomes lower than said reference voltage.

4. A driving circuit comprising:
   a triangular wave generator circuit for generating a triangular wave signal, said triangular wave signal having a constant frequency;
   an inverting circuit for receiving and inverting said triangular wave signal;
   an input terminal adapted to receive an input signal; a first and a second comparator, said first comparator including one input connected to said input terminal and another input connected to an output of said inverting circuit and said second comparator including one input connected to said input terminal and another input receiving said triangular wave signal;
   a third comparator having an input connected to said input terminal and generating a first control signal, said first control signal being in a high state when said input signal is positive and in a low state when said input signal is negative;
   an invertor connected to said third comparator for inverting said first control signal to generate a second control signal;

a NOR circuit including a first and a second input, said first input receiving an inverted output of said first comparator and said second input being connected to said second comparator, said NOR circuit generating a third control signal;

a NAND circuit including a first and a second input, said first input of said NAND circuit receiving an inverted output of said first comparator and said second input of said NAND circuit being connected to said second comparator, said NAND circuit generating a fourth control signal;

wherein said first, second, third and fourth control signals are adapted to control a plurality of transistors; and wherein said third and fourth control signals are pulse width modulated in accordance with a level of said input signal, said first control signal and said second control signal are caused to have either a high state or a low state in accordance with the level of said input signal such that said plurality of transistors are controlled to be turned on and off in accordance with said first and second control signals and said third and fourth control signals.

5. A driving circuit as in claim 4, wherein said first and second comparators are formed on one integrated circuit chip.

6. A modulator according to claim 4 in which:

at least a first one of said transistors is controlled to be turned on and off in accordance with said fourth control signal output from said NAND circuit only when said input signal becomes higher than a reference voltage; and at least a second one of said transistors is controlled to be turned on and off in accordance with said third control signal output from said NOR circuit only when said input signal becomes lower than said reference voltage.

7. A pulse width modulator comprising:

a triangular wave generator circuit for generating a triangular wave signal, said triangular wave signal having a constant frequency;

an input terminal adapted to receive an input signal;

an inverting circuit for receiving and inverting said input signal;

a first and a second comparator;

said first comparator having one input receiving said triangular wave signal and another input connected to said input terminal;

said second comparator having one input receiving said triangular wave signal and another input connected to an output of said inverting circuit;

a third comparator having an input connected to said input terminal, said third comparator generating a first control signal, said first control signal being in a high state when said input signal is positive and in a low state when said input signal is negative;

an invertor connected to an output of said third comparator for inverting said first control signal, said invertor generating a second control signal;

a NOR circuit including a first and a second input, said first input being connected to an output of said first comparator and said second input receiving an inverted output of said second comparator, said NOR circuit generating a third control signal;

a NAND circuit including a first and a second input, said first input of said NAND circuit being connected to said output of said first comparator and said second input of said NAND circuit receiving an inverted output of said second comparator, said NAND circuit generating a fourth control signal;

wherein said first, second, third and fourth control signals are adapted to control a plurality of transistors.

8. A pulse width modulator as in claim 7 wherein said first and second comparators are formed on one integrated circuit chip.

9. A modulator according to claim 7 in which:

at least a first one of said transistors is controlled to be turned on and off in accordance with said fourth control signal output from said NAND circuit only when said input signal becomes higher than a reference voltage; and at least a second one of said transistors is controlled to be turned on and off in accordance with said third control signal output from said NOR circuit only when said input signal becomes lower than said reference voltage.

10. A driving circuit comprising:

a triangular wave generator circuit for generating a triangular wave signal, said triangular wave signal having a constant frequency;

an input terminal adapted to receive an input signal;

an inverting circuit for receiving and inverting said input signal;

a first and second comparator;

said first comparator having one input receiving said triangular wave signal and another input connected to said input terminal;

said second comparator having one input receiving said triangular wave signal and another input connected to an output of said inverting circuit;

a third comparator having an input connected to said input terminal, said third comparator generating a first control signal, said first control signal being in a high state when said input signal is positive and in a low state when said input signal is negative;

an invertor connected to an output of said third comparator for inverting said first control signal, said invertor generating a second control signal;

a NOR circuit including a first and a second input, said first input being connected to an output of said first comparator and said second input receiving an inverted output of said second comparator, said NOR circuit generating a third control signal;

a NAND circuit including a first and a second input, said first input of said NAND circuit being connected to said output of said first comparator and said second input of said NAND circuit receiving an inverted output of said second comparator, said NAND circuit generating a fourth control signal which is pulse width modulated;

wherein said first, second, third and fourth control signals are adapted to control a plurality of transistors;

wherein said third and fourth control signals are pulse width modulated in accordance with a level of said input signal, said first control signal and said second control signal are caused to have either a high state or a low state in accordance with the level of said input signal such that said plurality of transistors are controlled to be turned on and off in accordance with said first and second control signals and said third and fourth control signals.

11. A driving circuit as in claim 10, wherein said first and second comparators are formed on one integrated circuit chip.

12. A modulator according to claim 7 in which:
at least a first one of said transistors is controlled to be turned on and off in accordance with said fourth control signal output from said NAND circuit only when said input signal becomes higher than a reference voltage; and
at least a second one of said transistors is controlled to be turned on and off in accordance with said third control signal output from said NOR circuit only when said input signal becomes lower than said reference voltage.

* * * * *